United States Patent
Winters et al.

Patent Number: 6,165,313
Date of Patent: Dec. 26, 2000

[54] DOWNSTREAM PLASMA REACTOR SYSTEM WITH AN IMPROVED PLASMA TUBE SEALING CONFIGURATION

[75] Inventors: Toby J. Winters; Moutasim O. Khogly, both of Austin; Terrance P. Melvin, Manchaca, all of Tex.

[73] Assignee: Advanced Micro Devices, Inc., Sunnyvale, Calif.

[21] Appl. No.: 09/291,707

[22] Filed: Apr. 14, 1999

[51] Int. Cl.⁷ .............................. H05H 1/00; C23C 16/00
[52] U.S. Cl. ............................................. 156/345; 118/733
[58] Field of Search ............................. 156/345; 118/733, 118/715, 723 MW, 723 ER, 504, 719

[56] References Cited

U.S. PATENT DOCUMENTS

| | | |
|---|---|---|
| 5,228,052 | 7/1993 | Kikuchi et al. . |
| 5,443,686 | 8/1995 | Jones et al. ................................ 216/37 |
| 5,560,803 | 10/1996 | Mihara et al. . |
| 5,722,668 | 3/1998 | Rice et al. ................................. 277/180 |
| 5,795,831 | 8/1998 | Nakayama et al. . |

OTHER PUBLICATIONS

4 pgs. of information TFE–O–SIL® O–Rings downloaded from www.row–inc.com on Jun. 10, 1999.

*Primary Examiner*—Gregory Mills
*Assistant Examiner*—Parviz Hassanzadeh
*Attorney, Agent, or Firm*—Kevin L. Daffer; Conley, Rose & Tayon

[57] ABSTRACT

A downstream plasma reactor system is presented. The reactor system includes a reaction chamber. An inlet conduit is connected to the reaction chamber. A plasma tube is coupled to the inlet conduit. A sealing member is interposed between the plasma tube and the inlet conduit. A blocking member, preferably containing a fluorocarbon polymer, is also interposed between the plasma tube and the inlet conduit. The blocking member is positioned closer to the discharge opening of the plasma tube than the sealing member and is preferably capable of preventing a substantial quantity of plasma-generated reactive species from reaching the sealing member during operation of the reactor system.

11 Claims, 6 Drawing Sheets

ND STREAM PLASMA REACTOR SYSTEM WITH AN IMPROVED PLASMA TUBE SEALING CONFIGURATION

BACKGROUND OF THE INVENTION

1. Field of the Invention

This invention relates to semiconductor processing equipment and, more particularly, to a downstream plasma reactor system employing an improved plasma tube sealing configuration, and to a method for configuring such a reactor system.

2. Description of the Related Art

Plasma processing is commonly used in semiconductor fabrication. One use for plasma processing is in the removal of layers formed on a substrate, typically by etching some or all of a particular layer. Plasma processing is often performed in single chamber reactor systems in which the plasma is generated exclusively in the chamber in which processing is carried out. Alternatively, downstream plasma reactor systems may be used that first convert gases into plasma in a plasma tube and then transport the plasma-generated reactive species downstream into the reaction chamber. These reactor systems can be used to avoid the radiation damage and resist hardening common in single chamber plasma reactor systems. And like single chamber plasma reactor systems, downstream plasma reactor systems can be used to create reactive species capable of etching layers of silicon dioxide, silicon nitride, aluminum, and various other materials commonly used in semiconductor fabrication.

A common use for downstream plasma reactor systems is in resist stripping, i.e., the removal of patterned photoresist after completion of an etch step. Resist stripping usually is carried out in an ashing process in which the resist is oxidized to a gaseous form and removed from the reaction chamber. Those downstream plasma reactor systems that are specifically configured for resist stripping are labeled downstream plasma strippers.

Figure 1:
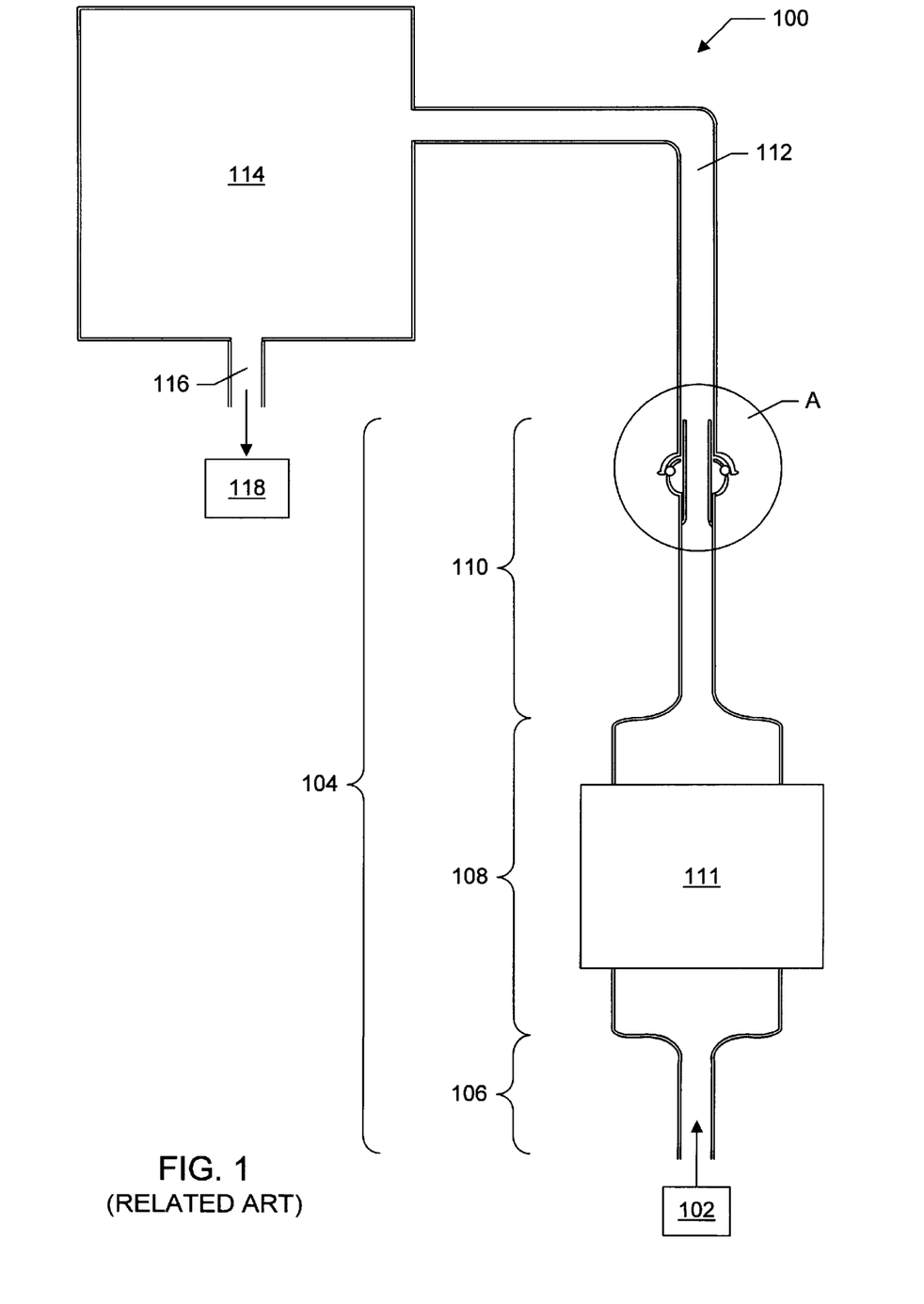
FIG. 1 is a schematic view of a conventional downstream plasma reactor system.

FIG. 1 presents a schematic view of an exemplary downstream plasma reactor system 100, the GaSonics L3500, which is commercially available from GaSonics International, San Jose, Calif. Downstream plasma reactor system 100 may be properly labeled a downstream plasma stripper because it is primarily configured to remove resist. Reactor system 100 includes a plasma tube 104. Plasma tube 104 is made up of an intake portion 106, a central portion 108, and a discharge portion 110. Gas source 102 is in gaseous communication with intake portion 106 of plasma tube 104. Plasma tube 104 is coupled to inlet conduit 112. Inlet conduit 112 is connected to reaction chamber 114. Plasma generating apparatus 111 is positioned adjacent to plasma tube central portion 108, and includes a power supply and a microwave generator. Outlet conduit 116 is connected to reaction chamber 114 and is in selective gaseous communication with vacuum pump 118.

During operation of downstream plasma reactor system 100, vacuum pump 118 may be used to evacuate gases from reaction chamber 114 and all conduits in gaseous communication with reaction chamber 114, including inlet conduit 112 and plasma tube 104. Gases may be introduced into plasma tube 104 from gas source 102 via intake portion 106. The desired amounts and proportions of gases supplied by gas source 102 may be regulated using one or more mass flow controllers. These gases are typically selected such that the reactive species generated upon plasma formation are appropriate for the particular process being performed. As the gases enter central portion 108, microwaves created by plasma generating apparatus 111 convert at least a portion of the entering gases into plasma. The plasma generated in central portion 108 subsequently passes into discharge portion 110. From discharge portion 110, the plasma is conveyed into inlet conduit 112. The plasma is transported through inlet conduit 112 into reaction chamber 114 to be used in processing.

Figure 2:
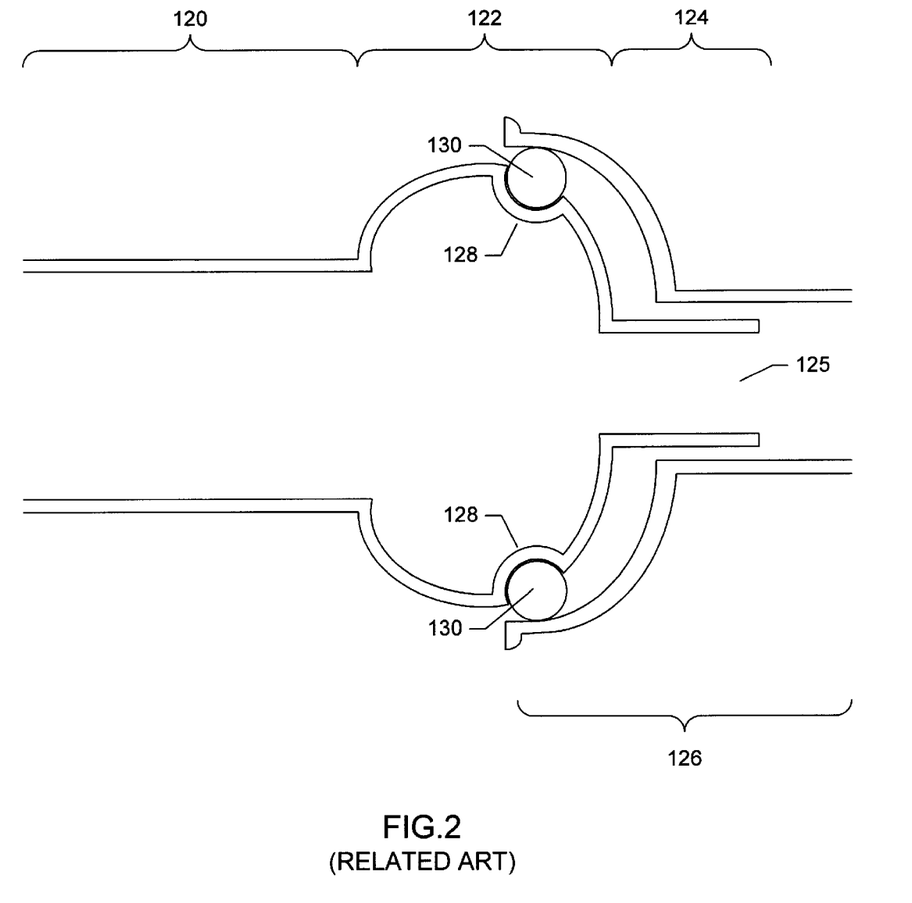
FIG. 2 is a cross-sectional view of section A of the reactor system depicted in FIG. 1.

FIG. 2 presents an expanded cross-sectional view of section A of reactor system 100. Section A includes parts of discharge portion 110 of plasma tube 104 and coupling portion 126 of inlet conduit 112. As shown in FIG. 2, discharge portion 110 may be subdivided into a first section 120, an expanded section 122, and a second section 124. Discharge opening 125 is defined at the end of second section 124. Sealing o-ring groove is defined within expanded section 122 and is configured to hold sealing o-ring 130. Sealing o-ring 130 is composed of an elastomeric material. Sealing o-ring 130 is configured to make a seal between plasma tube 104 and inlet conduit 112 sufficient to maintain the level of vacuum desired.

Sealing o-ring 130 should not only provide a good seal between plasma tube 104 and inlet conduit 112, but should be able to maintain such a seal over numerous operation cycles carried out over a sizable time period. To maintain a sufficient seal over repeated operation cycles, sealing o-ring 130 should possess ample resiliency. Good resiliency in sealing o-ring 130 is important because when reactor system 100 is under vacuum during an operation cycle, coupling portion 126 exerts substantial lateral force on the sealing o-ring. Then when the cycle is completed, the vacuum is released and the lateral force exerted by coupling section subsides. A sufficiently resilient sealing o-ring 130 is able to compress during operation of a cycle and then return to its original shape after the cycle is complete. Consequently, the quality of the seal may be maintained over numerous operation cycles.

In addition, it is desirable that the time between failures of sealing o-ring 130 be extended as long as is reasonably possible. Replacing sealing o-ring 130 requires the purchase of a new o-ring and necessitates the expenditure of limited employee time. Over time, the total value of the production lost during these replacement periods can become quite substantial.

Unfortunately, the operating conditions of reactor system 100 can greatly reduce the amount of time between failures of sealing o-ring 130. One explanation for this outcome is the presence of numerous reactive species in the gases exiting the plasma tube. Most of these reactive species will pass directly into the inlet conduit, but some end up in contact with sealing o-ring 130. While these plasma-generated reactive species do not substantially erode the fused quartz of which plasma tube 104 is constructed, other elements of the plasma system, such as sealing o-ring 130, are often constructed of materials more susceptible to such erosion. Furthermore, resist stripping often incorporates hydrogen- and oxygen-containing plasmas that have a particularly pronounced ability to degrade many commonly used sealing materials. As such, the chemical resistance of sealing o-ring 130 to plasma-generated radicals can greatly influence the average time between failure of such an o-ring.

In an attempt to resolve these problems, numerous chemically resistant elastomers have been used for sealing o-ring 130. One of these is Viton®, a fluoroelastomer commercially available from DuPont Dow Elastomers, Wilmington, Del. Viton® has good resiliency, and is suitable for use in vacuum operations. But while Viton® and similar fluoroelastomers possess some chemical resistivity, they generally are still relatively susceptible to erosion by plasma-generated reactive species. Over time, the constant attack of these reactive species can break off portions of sealing o-ring 130. These portions may then be swept into the reaction chamber 114 where they can cause damage serious enough to prevent the formation of functioning integrated circuits. Eventually, plasma-generated reactive species can even erode enough of sealing o-ring 130 to cause its complete failure. When used as sealing o-ring 130 in reactor system 100, such o-rings often fail in less than three days—an undesirably short time period.

Increased success has been obtained using materials such as Kalrez® (a perfluoroelastomer commercially available from DuPont Dow elastomers) and Chemraz® (a perfluoroelastomer commercially available from Green, Tweed & Co, Kulpsville, Pa. Because of the enhanced chemical resistivity of these materials, a sealing o-ring 130 made of such perfluoroelastomers typically lasts longer than a sealing o-ring 130 made of a fluoroelastomer like Viton®. These materials are more expensive than Viton®, however, and still often fail in only 7 days of operation.

One type of o-ring that has been able to increase the time before erosion-induced failure of sealing o-ring 130 is an o-ring encapsulated with Teflon® (a fluorocarbon polymer commercially available from E.I. du Pont de Nemours and Company). Teflon® encapsulated o-rings typically include a Teflon® jacket that surrounds an elastomer core. These o-rings are substantially more resistant to erosion by plasma-generated reactive species than the elastomeric materials mentioned above.

Unfortunately, Teflon®-encapsulated o-rings are not well suited for use as sealing o-ring 130. The Teflon® jacket of these o-rings makes these o-rings less resilient than elastomeric o-rings. The inflexibility of Teflon®-encapsulated o-rings compared to o-rings composed of elastomeric materials can increase the difficulty of coupling plasma tube 104 and inlet conduit 112. And because of the relative lack of resiliency in the Teflont® jacket, a Teflon®-encapsulated o-ring may not be able to fully return to its original shape after being compressed during an operation cycle. Over numerous compression and expansion cycles, a Teflon®-encapsulated sealing o-ring may become substantially deformed. The discrepancy between the sealing o-ring's original shape and its deformed shape can significantly reduce the sealing ability of the o-ring. Eventually, a Teflon®-encapsulated sealing o-ring 130 may become so deformed that it can no longer make the necessary seal. Even worse, the buildup of microstresses in the Teflon® jacket of the o-ring can cause the o-ring jacket to crack, potentially creating an immediate loss of vacuum.

Therefore, it would be desirable to develop a downstream plasma reactor system with an improved plasma tube sealing configuration. The improved design should significantly extend the mean time between failure of the seal between the plasma tube and an inlet conduit to a reaction chamber. This improved sealing configuration should be able to be incorporated without significantly increasing the install difficulty or reducing the seal quality.

SUMMARY OF THE INVENTION

The problems described above are in large part addressed by a downstream plasma reactor system employing an improved plasma tube sealing configuration. The reactor system includes a reaction chamber. An inlet conduit is connected to the reaction chamber. A plasma tube is coupled to the inlet conduit. A sealing member is interposed between the plasma tube and the inlet conduit. A blocking member, preferably containing a fluorocarbon polymer, is also interposed between the plasma tube and the inlet conduit. The blocking member is positioned closer to the discharge opening of the plasma tube than the sealing member and is preferably capable of preventing a substantial quantity of plasma-generated reactive species from reaching the sealing member during operation of the reactor system. As compared to plasma tube sealing arrangements in conventional reactor systems, the presently described configuration can extend mean time between seal failure without reducing seal quality.

The blocking member is preferably a seal such as a blocking o-ring. The blocking o-ring preferably includes a jacket portion containing fluorocarbon polymer that surrounds a core portion containing an elastomer. The jacket portion may include a fluorocarbon polymer, and preferably includes one of the fluorocarbon polymers available under the trademark Teflon® from and commercially available from E.I. du Pont de Nemours and Company. Exemplary fluorocarbon polymers include perfluoroalkoxy polymer, fluorinated ethylene propylene polymer, and polytetrafluoroethylene. The core portion may be composed of numerous elastomeric materials; suitable elastomers include fluoroelastomers, siloxane polymers (i.e., silicone), and ethylene-propylene-diene monomer.

Because the composition and position of the blocking member reduces the exposure of the sealing member to plasma-generated reactive species, the chemical resistivity to such species of the sealing material is less important than in many conventional designs. Consequently, the sealing member may be composed of cheaper elastomers with reduced chemical resistances without sacrificing sealing performance or decreasing mean time between seal failure. The sealing member is preferably a seal such as a sealing o-ring.

Glands in which the sealing o-ring and the blocking o-ring can be arranged are preferably defined in the plasma tube. These glands may be a sealing o-ring groove defined in a central section of a discharge portion of the plasma tube and a blocking o-ring groove arranged in a second section (near the discharge opening) of the discharge portion of the plasma tube. These grooves are preferably configured such that a portion, but not all, of the appropriate o-ring fits securely therein.

It was noted above that some of the disadvantages of using Teflon®-encapsulated o-rings as sealing o-rings were that such o-rings could hinder coupling of the plasma tube with the inlet conduit and were susceptible to deformation over repeated operation cycles. A blocking member as described herein, however, preferably avoids these disadvantages. For instance, the position of blocking o-ring groove preferably allows the blocking o-ring to be situated in a manner that allows the coupling section of the inlet conduit to slide over the blocking o-ring during the coupling process. The majority of the lateral forces applied during coupling of the plasma tube with the inlet conduit preferably fall on the sealing o-ring, which may be composed of a more resilient material than the blocking o-ring and is thus better suited to receive such forces.

Furthermore, the sealing member and the blocking member may both be in contact with the coupling section of the inlet conduit during operation. Consequently, both the blocking member and the sealing member may provide a seal between the plasma tube and the inlet conduit. It is preferred, however, that the seal provided by the sealing member be substantially tighter than the seal provided by the blocking member. Such an arrangement can extend the lifetime of the relatively inflexible materials that may be used in the jacket portion of the blocking o-ring.

An improved plasma tube is also presented. The plasma tube may be generally characterized as a vessel into which gases are introduced, in which gases are at least partially converted into plasma, and from which plasma-generated reactive species are evacuated. The plasma tube preferably includes an intake portion, a central portion, and a discharge portion. The central portion is interposed between the intake portion and the discharge portion. A discharge opening may be defined at the end of the discharge portion. A sealing member groove configured to receive a sealing member and a blocking member groove configured to receive a blocking member may both be defined in the discharge portion of the plasma tube. The blocking member groove, however, is preferably closer to the discharge opening than the sealing member groove.

A method for configuring a downstream plasma reactor system is also presented. The method involves providing a plasma tube, the plasma tube preferably including a discharge portion. A discharge opening may be defined in the end of the discharge portion of the plasma tube. A sealing member is positioned on the plasma tube. A blocking member, preferably containing a fluorocarbon polymer, is positioned on the plasma tube. However, the blocking member is preferably positioned closer to the discharge opening than the sealing member. The plasma tube may then be coupled with an inlet conduit to a reaction chamber.

A method for operating a plasma system is also presented. The method preferably involves forwarding a sealing member proximate a discharge opening of a plasma tube against a coupling section of an inlet conduit to compress the sealing member against the coupling section while concurrently drawing a blocking member within the inlet conduit. The inlet conduit is preferably connected to a reaction chamber. The step of forwarding the sealing member may involve applying vacuum pressure within the inlet conduit for drawing the sealing member against the coupling section. Vacuum pressure may be applied by use of a vacuum pump in selective gaseous communication with the reaction chamber connected to the inlet conduit. The step of drawing a blocking member within the inlet conduit preferably involves positioning the blocking member in a gas sealing arrangement between an outer surface of the plasma tube and an inner surface of the inlet conduit. The positioning of the blocking member in a gas sealing arrangement preferably entails forwarding the blocking member further into the inlet conduit than said sealing member.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 3:
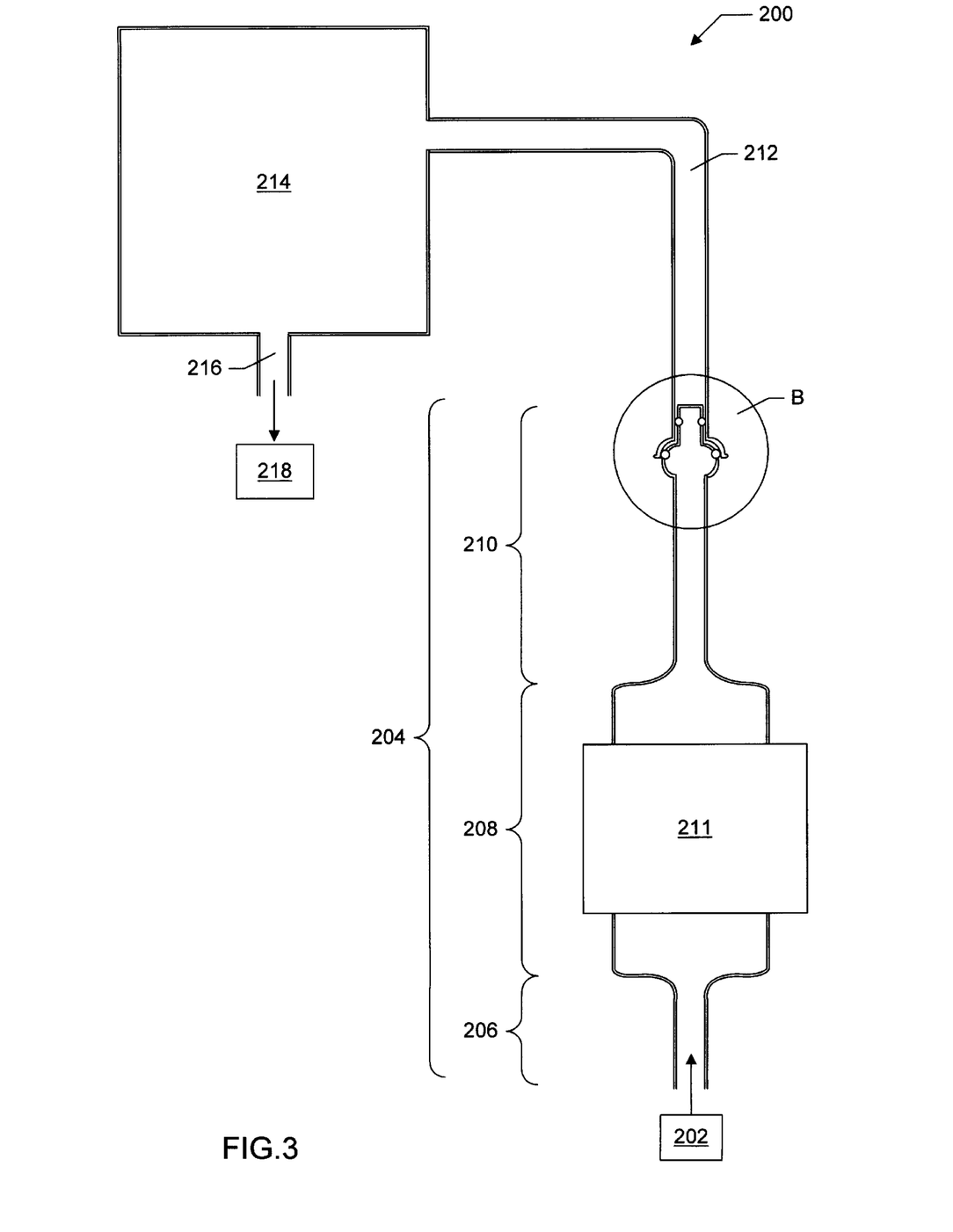
FIG. 3 is a schematic view of an improved downstream plasma reactor system in accordance with an embodiment.

An embodiment of an improved downstream plasma reactor system is depicted in FIG. 3. Downstream plasma reactor system 200 may be understood to represent an improved version of the GaSonics L3500 downstream plasma stripper described above. Alternately, downstream plasma reactor system 200 may be considered to represent other similarly configured reactor systems. Reactor system 200 preferably includes a plasma tube 204 in which plasma may be formed during operation. Plasma tube 204 may include an intake portion 206, a central portion 208, and a discharge portion 210. Gas source 202 may be selectively configured to be in gaseous communication with intake portion 206 of the plasma tube. Plasma tube 204 may be connected to reactor chamber 214 through a coupling arrangement with inlet conduit 212. Inlet conduit 212 may be either directly or indirectly connected to reaction chamber 214. Plasma generating apparatus 211 is preferably positioned adjacent to plasma tube central portion 208. The plasma generating apparatus is capable of generating an electric field sufficient to convert a portion of the gases entering the plasma tube into plasma, and in an embodiment may include a microwave generating apparatus coupled to a power supply.

Plasma tube 204 may be constructed of a variety of materials compatible with plasma formation, but is preferably composed of fused quartz. The plasma tube preferably has a length of about 16 inches, and more preferably has a length of about 16.12 inches. Intake portion 206 preferably has a length of about 2 inches. The diameter of intake portion 206 is preferably about 15–18 mm. Intake portion 206 may include a coupling portion, preferably a size 28/15 socket, for mating with another pipe. Central portion 208 preferably has a length of about 8 inches, and more preferably has a length of about 8.25 inches. The diameter of central portion 208 is preferably about 73–77 mm. Discharge portion 210 preferably has a length of about 6 inches, and more preferably has a length of about 5.87 inches.

Figure 8:
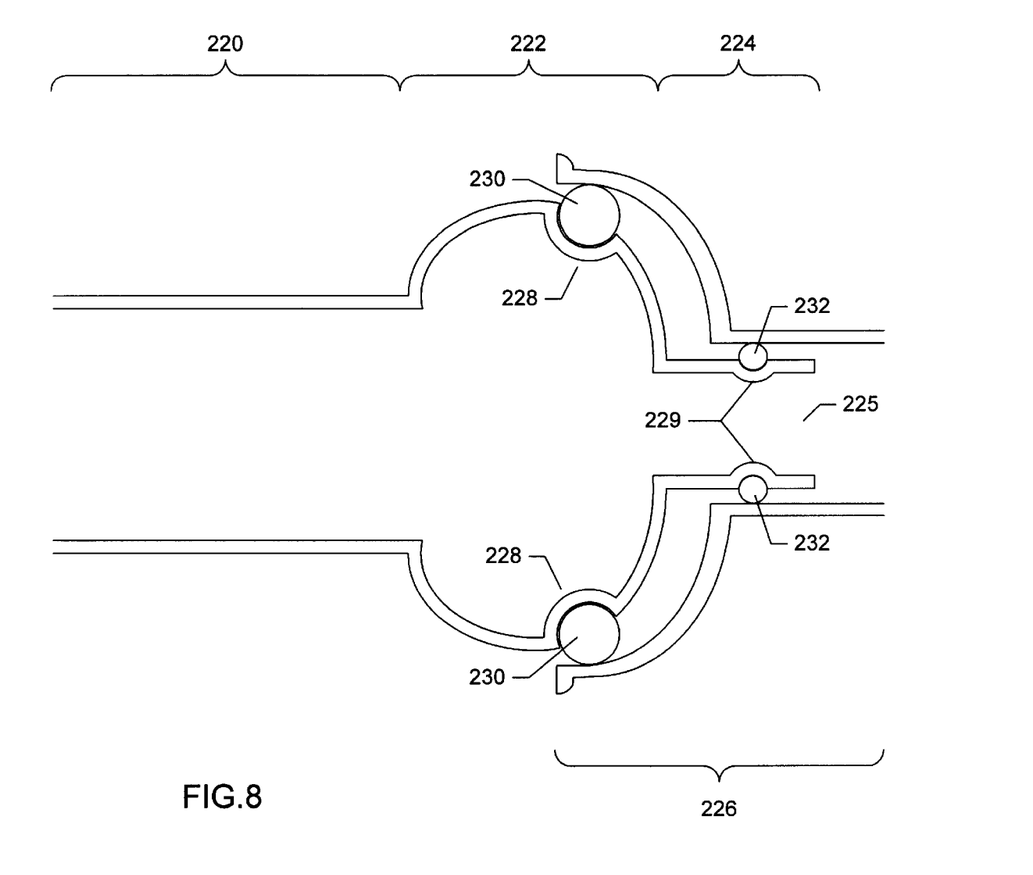
FIG. 8 is an enlarged view of section B of the reactor system depicted in FIG. 3, at a point in time after the coupling of the plasma tube and the inlet conduit.

A closer view of section B of reactor system 200 (in a fully coupled configuration) is presented in FIG. 8. Section B of reactor system 200 includes parts of discharge portion 210 of plasma tube 204 and coupling portion 226. Plasma tube discharge portion 210 may be conceptually subdivided into a first section 220, an expanded portion 222, and a second section 224. A, discharge opening 225 is defined at the end of second section 224. A gland such as sealing member groove 228 is preferably circumferentially defined along expanded portion 222. The sealing member groove is preferably configured to receive a sealing member. In an embodiment, the sealing member is a seal such as sealing o-ring 230. Sealing o-ring 230 is at least partially arranged within sealing member groove 228. A gland such as blocking member groove 229 is preferably circumferentially defined along second section 224, and may be configured to receive a blocking member. In an embodiment, the blocking member is a seal such as blocking o-ring 232. Blocking o-ring 232 is at least partially arranged within blocking o-ring groove 229.

First section 220 preferably has a diameter of about 25–28 mm. Expanded portion 226 may serve as a joint, and is preferably a size 35/25 ball joint. Second section 224 may have a diameter less than that of first section 220; preferably, the diameter of second section 224 is about 20–22 mm. Second section 224 may have a length of less than 2 inches. The distance from blocking member groove 229 and discharge opening 225 may be about 0.3 inches. Preferably, both blocking member groove 229 and sealing member groove 228 extend around the circumference of their respective portions of plasma tube 204. Coupling section 226 may be formed as a socket, preferably a size 25/35 ball joint socket.

Figure 5:
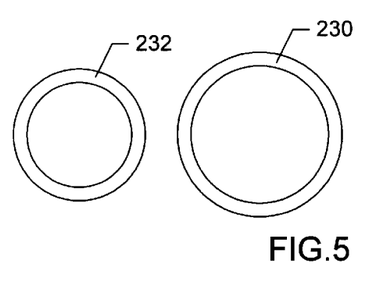
FIG. 5 is a top plan view of a blocking member and a sealing member configured for use in the reactor system depicted in FIG. 3.

As shown in FIG. 5, blocking o-ring 230 and sealing o-ring 232 are preferably of dissimilar sizes. In an embodiment, blocking o-ring 232 is a size 117 o-ring and sealing o-ring 230 is a size 121 o-ring. O-ring size designations, such as 117 and 121, are standard within the industry and are well known for someone skilled in the art. A 117 size o-ring has an inner diameter of 0.799+/−0.010 inches and a thickness of 0.103+/−0.003 inches; a 121 o-ring size has an inner diameter of 1.049+/−0.010 inches and a thickness of 0.103+/−0.003 inches. The sizes of blocking o-ring 232 and sealing o-ring 230 may be selected such that the o-rings fit securely into their respective grooves but can nevertheless be installed without tremendous difficulty. Preferably, the blocking and sealing o-rings are toroidally shaped, but can take other shapes depending on, for example, the shape of the plasma tube.

The blocking member is preferably substantially more resistant to erosion by plasma-generated reactive species than the sealing member. It is not required that the blocking member be more resistant to erosion by plasma-generated reactive species under all conditions, though this may be true; it is more important that the blocking member possess this enhanced chemical resistivity under the operation conditions of the particular reactor system used.

Figure 6:
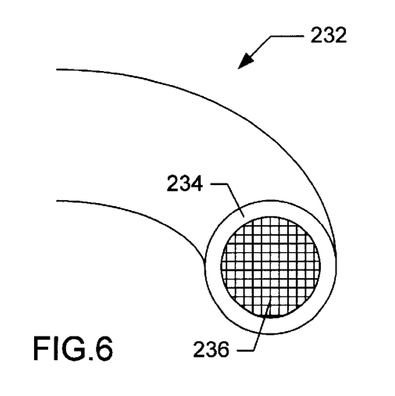
FIG. 6 is a partial cross-sectional view of the blocking member depicted in FIG. 5.

One manner by which this goal may be accomplished is depicted in FIG. 6. As this partial cross-sectional view of blocking o-ring 232 shows, the blocking o-ring preferably includes a jacket portion 234 and a core portion 236. Jacket portion 234 is preferably composed of a fluorocarbon polymer, and core portion 236 is preferably composed of an elastomer. The fluorocarbon polymer of which jacket portion 234 is composed is preferably more resistant to erosion by plasma generated reactive species than elastomers such as Viton®, Kalrez®, and Chemraz®. Suitable fluorocarbon polymers include perfluoroalkoxy polymer, fluorinated ethylene propylene polymer, and polytetrafluoroethylene. It should be understood that the jacket portion might also contain chemicals not classified as fluorocarbon polymers. Preferably, the jacket portion is composed of one of the fluorocarbon polymers sold under the trademark Teflon® and commercially available from E.I. du Pont de Nemours and Company.

Core portion 236 is preferably composed of an elastomer. Suitable elastomers include silicone and ethylene-propylene-diene monomer. Fluoroelastomers, such as Viton®, may also be incorporated into core portion 236 of blocking o-ring 232. The core portion may be solid or hollow. A blocking o-ring with a jacket portion containing a fluorocarbon polymer and a core portion containing an elastomer preferably combines the qualities of chemical inertness and resiliency in a manner particularly suited for the desired use of blocking o-ring 232. In a preferred embodiment, blocking o-ring 232 is a Teflon®-encapsulated silicone-core o-ring available as part number 73230-02TEFLON-117SIL from Austin Seal Co., Austin, Tex. A similar o-ring is available from Row, Inc., Addison, Ill.

Because blocking o-ring 232 preferably serves to greatly reduce the exposure of sealing o-ring 230 to plasma-generated reactive species during operation, the materials of which the sealing member is composed may be selected more for their sealing qualities than for their chemical resistivity. Sealing member 230 may be composed of an elastomer. In an embodiment, sealing o-ring 230 is composed of a fluoroelastomer such as Viton®. While the sealing member may be composed of perfluoroelastomers such as Kalrez® and Chemraz®, the presence of the blocking member can reduce the benefits of such o-rings over conventional setups. Thus, the often increased cost of such o-rings over other, less chemically resistant elastomers, may be avoided.

Figure 4:
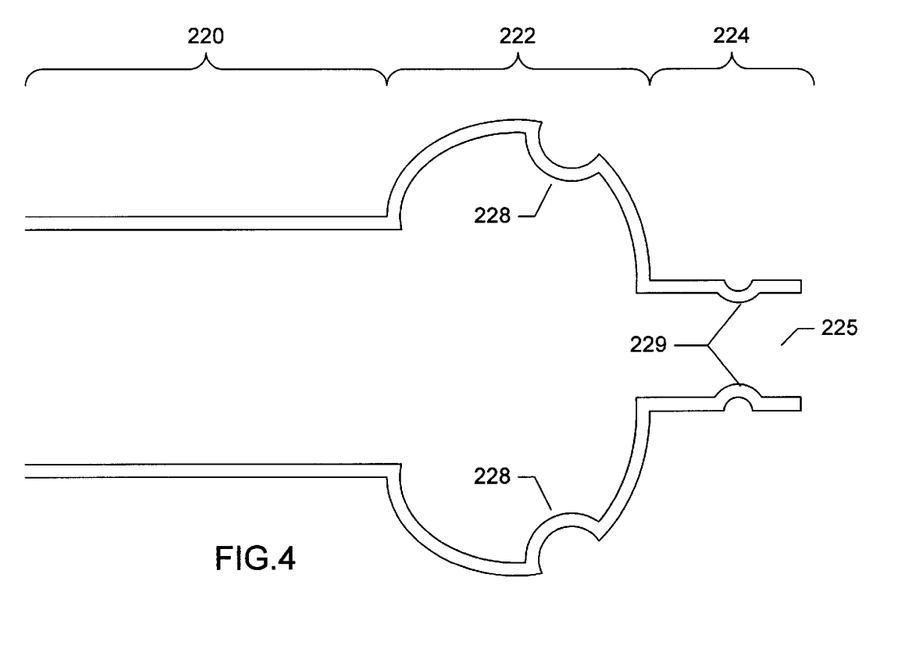
FIG. 4 is a cross-sectional view of a plasma tube as depicted in section B of the reactor system shown in FIG. 3, at a point in time before the positioning of a sealing member and a blocking member.

A method for configuring reactor system 200 such that plasma tube 204 and inlet conduit 212 are coupled as shown in FIGS. 3 and 8 is also presented. As shown in FIG. 4, plasma tube 204 may initially not have sealing o-ring 230 and blocking o-ring 232 within sealing member groove 228 and blocking member groove 229. Blocking o-ring 232 and sealing o-ring 230 may then be positioned on plasma tube 204 in blocking member groove 229 and sealing member groove 228, respectively. Blocking o-ring 232 may be positioned either before or after sealing o-ring 230. Techniques to increase the ease of installation of these o-rings may be incorporated in manners that would be apparent to one of ordinary skill in the art having the benefit of the present disclosure.

Figure 7:
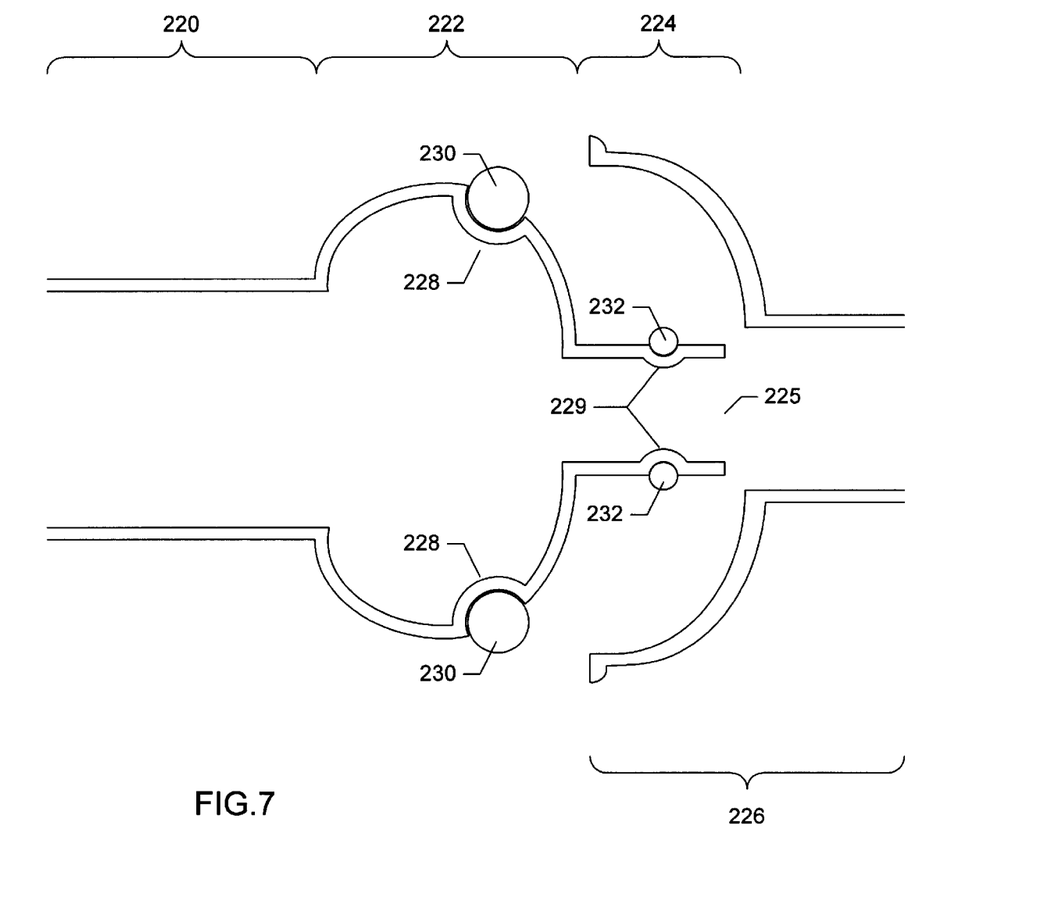
FIG. 7 is an enlarged view of section B of the reactor system depicted in FIG. 3, at a point in time prior to coupling of the plasma tube and the inlet conduit.

A view of the plasma tube after positioning of sealing o-ring 230 and blocking o-ring 232 is shown in FIG. 7. Discharge portion 210 of plasma tube 204 may then be positioned near coupling section 226 of inlet conduit 212. Then as shown in FIG. 8, discharge portion 210 may be inserted within coupling section 226 to couple the plasma tube with the inlet conduit. In the coupled configuration, both sealing o-ring 230 and blocking o-ring 232 may be in contact with coupling section 226. As such, both the blocking o-ring and the sealing o-ring may provide a seal between the plasma tube and the inlet conduit.

It is preferred, however, that the seal provided by the sealing member be substantially tighter than the seal provided by the blocking member. Such an arrangement can extend the lifetime of the relatively inflexible materials that may be used in the jacket portion of the blocking o-ring. If desired, however, the blocking member may provide significant sealing action without departing from the scope of the present disclosure. As depicted in FIG. 8, the blocking member is preferably positioned closer to discharge opening than the sealing member. This configuration allows the blocking member to prevent a substantial portion of the plasma-generated reactive species produced in operation from reaching the sealing member.

An exemplary method of operation for reactor system 200 may be illustrated by reference to FIGS. 3 and 8. During operation, vacuum pump 218 maybe used to evacuate gases from reaction chamber 214 and all conduits in gaseous communication with the reaction chamber. This evacuation may be accomplished in a series of steps each having different rates of gas removal. After a suitable level of vacuum has been established, the desired gases may be introduced into plasma tube 204 from gas source 202. The desired amount and proportion of gases supplied by gas source 202 may be regulated using one or more mass flow controllers. The particular gases introduced into plasma tube 204 are chosen to generate a certain concentration and type of reactive species upon the subsequent creation of a plasma. Gas source 202 may also supply inert gases that are not intended to react with the materials in reaction chamber 214 but do serve to improve the quality of the processes carried out therein.

As the gases enter central portion 208, they are exposed to microwaves created by plasma generating apparatus 211. The exposure of the gases to a sufficient level and quantity of microwave radiation converts the gases to plasma, a process that generates the reactive species desired for subsequent processing. The plasma-generated reactive species are transported into discharge portion 210, and from there they enter inlet conduit 212. From inlet conduit 212, the gases are transported into reactor chamber 214 for use in processing.

As described earlier, however, some portion of the plasma-generated reactive species leaving the plasma tube fails to immediately enter the reactor chamber inlet conduit and is instead diverted back around discharge opening 225. In conventional setups that do not utilize a blocking member such as blocking o-ring 232, all of these gases are able to contact the sealing o-ring. A blocking member as described herein, however, is capable of preventing a substantial portion of the plasma-generated reactive species exiting discharge opening 225 from reaching the sealing member.

It will be appreciated by those skilled in the art having the benefit of this disclosure that the present disclosure is believed to provide a downstream plasma reactor system with an improved plasma tube sealing configuration, as well as a method of configuring and operating such a reactor system. Further modifications and alternative embodiments of various aspects of the invention will be apparent to those of ordinary skill in the art in view of this description. For example, multiple blocking members could be utilized in certain designs. Furthermore, the present disclosure is not intended to be limited to one model of downstream plasma reactor system; on the contrary, it is believed that, among other things, the present disclosure may apply to numerous situations in which a plasma is generated in one vessel and transported to another vessel. It is intended that the following claims be interpreted to embrace all such modifications and changes and, accordingly, the specification and drawings are to be regarded in an illustrative rather than a restrictive sense.

What is claimed is:

1. A downstream plasma reactor system, comprising:
   a reaction chamber;
   an inlet conduit connected to said reaction chamber;
   a plasma tube coupled to said inlet conduit, the plasma tube comprising a discharge opening;
   a sealing member interposed between said plasma tube and said inlet conduit; and
   a blocking member interposed between and in contact with said plasma tube and said inlet conduit, wherein said blocking member is arranged closer to said discharge opening of said plasma tube than said sealing member and wherein said sealing and blocking members comprise sealing and blocking o-rings, respectively, and wherein said sealing and blocking o-rings have different material compositions.

2. The system of claim 1, wherein said blocking member is capable of preventing a substantial amount of the plasma-generated reactive species exiting the discharge opening during operation of the system from reaching said sealing member.

3. The system of claim 1, wherein said sealing member provides a seal between said plasma tube and said inlet conduit, and wherein said blocking member provides a seal between said plasma tube and said inlet conduit, and wherein the seal provided by the sealing member is substantially tighter than the seal provided by the blocking member.

4. The system of claim 1, wherein said blocking member is substantially more resistant to erosion by plasma-generated reactive species than said sealing member.

5. The system of claim 4, wherein said blocking member is a blocking o-ring and said sealing member is a sealing o-ring, and wherein the blocking o-ring is substantially more resistant to erosion by plasma-generated reactive species than said sealing o-ring.

6. The system of claim 1, wherein the blocking member comprises a jacket portion surrounding a core portion, and wherein the jacket portion of the blocking member comprises a fluorocarbon polymer, and wherein the core portion comprises an elastomer.

7. The system of claim 6, wherein said jacket portion comprises a fluorocarbon polymer selected from the group consisting of perfluoroalkoxy polymer, fluorinated ethylene propylene polymer, and polytetrafluoroethylene.

8. The system of claim 6, wherein said core portion comprises an elastomer selected from the group consisting of fluoroelastomers, silicone, and ethylene-propylene-diene monomer.

9. The system of claim 1, wherein said blocking member is a blocking o-ring and said sealing member is a sealing o-ring, and wherein said plasma tube comprises a blocking o-ring groove in which the blocking o-ring is at least partially arranged and a sealing o-ring groove in which the sealing o-ring is at least partially arranged.

10. The system of claim 9, wherein the sealing o-ring comprises a larger diameter than the blocking o-ring.

11. The system of claim 1, wherein said blocking member is a blocking o-ring and said sealing member is a sealing o-ring, and wherein said plasma tube comprises a blocking o-ring groove in which the blocking o-ring is at least partially arranged and a sealing o-ring groove in which the sealing o-ring is at least partially arranged, and wherein the blocking o-ring is substantially more resistant to erosion by plasma-generated reactive species, then said sealing o-ring and wherein the blocking o-ring comprises a jacket portion surrounding a core portion, and wherein the jacket portion of the blocking member comprises a fluorocarbon polymer, and wherein the core portion comprises an elastomer, and wherein the sealing o-ring comprises an elastomer, and wherein said blocking member is capable of preventing a substantial amount of the plasma-generated reactive species exiting said discharge opening during operation of the system from reaching said sealing member.

* * * * *

UNITED STATES PATENT AND TRADEMARK OFFICE
CERTIFICATE OF CORRECTION

PATENT NO. : 6,165,313  
DATED : December 26, 2000  
INVENTOR(S) : Winters et al.

Page 1 of 1

It is certified that error appears in the above-identified patent and that said Letters Patent is hereby corrected as shown below:

Column 10, claim 1,
Line 6, after the phrase "plasma tube than said" please delete "scaling" and substitute therefor -- sealing --.

Column 10, claim 11,
Line 56, after the phrase "plasma-generated reactive species" please delete ", then" and substitute therefor -- than --.

Signed and Sealed this

Eighteenth Day of December, 2001

Attest:

JAMES E. ROGAN
*Director of the United States Patent and Trademark Office*

*Attesting Officer*